United States Patent [19]
Cho et al.

[11] Patent Number: 5,237,235
[45] Date of Patent: Aug. 17, 1993

[54] SURFACE ACOUSTIC WAVE DEVICE PACKAGE

[75] Inventors: Frederick Y. Cho, Scottsdale; David Penunuri, Fountain Hills; Robert F. Falkner, Jr., Phoenix, all of Ariz.

[73] Assignee: Motorola, Inc., Schaumburg, Ill.

[21] Appl. No.: 767,338

[22] Filed: Sep. 30, 1991

[51] Int. Cl.$^5$ .......................................... H01L 41/08
[52] U.S. Cl. ............................... 310/313 R; 310/344; 29/25.35
[58] Field of Search .................. 310/313 R, 340, 344; 333/195; 29/25.35

[56] References Cited

U.S. PATENT DOCUMENTS

| | | | |
|---|---|---|---|
| 3,885,173 | 5/1975 | Lee | 310/313 R |
| 3,982,113 | 9/1976 | Caldran | 333/195 |
| 4,213,104 | 7/1980 | Cullen et al. | 310/341 |
| 4,381,469 | 4/1983 | Ogawa et al. | 310/346 |
| 4,480,148 | 10/1984 | Archer | 174/51 |
| 4,734,608 | 3/1988 | Takoshima | 310/313 R |
| 4,795,934 | 1/1989 | Rogerson et al. | 310/313 R |
| 4,993,000 | 2/1991 | Niitsuma et al. | 367/140 |
| 5,059,848 | 10/1991 | Mariani | 310/313 R |

FOREIGN PATENT DOCUMENTS

| | | | |
|---|---|---|---|
| 3048817 | 9/1981 | Fed. Rep. of Germany | 333/195 |
| 3138743 | 4/1983 | Fed. Rep. of Germany | 333/193 |
| 0077715 | 5/1984 | Japan | 310/344 |

Primary Examiner—Mark O. Budd
Assistant Examiner—Thomas M. Dougherty
Attorney, Agent, or Firm—Frederick M. Fliegel; Frank J. Bogacz

[57] ABSTRACT

A surface acoustic wave (SAW) device package for reducing insertion loss and direct RF feedthrough of the SAW device is disclosed. The package provides for extensive shielding of each of the input and output pads. The inputs and outputs to the SAW device are separated by maintaining the inputs on one surface of the substrate and the outputs on the opposite surface of the substrate. The SAW crystal substrate including the SAW devices is bonded to the package substrate and the package is hermetically sealed via a low-temperature glass seal or solder-type sealing, for example.

18 Claims, 4 Drawing Sheets

SURFACE ACOUSTIC WAVE DEVICE PACKAGE

BACKGROUND OF THE INVENTION

The present invention pertains to surface acoustic wave devices and more particularly to low insertion loss surface acoustic wave devices.

Surface acoustic wave (SAW) devices are typically small filtering elements used in RF applications. Mounting of the SAW on a substrate and electrical interconnection of input and outputs to the SAW device introduce parasitic capacitance and resistance which result in relatively high insertion loss and increased RF feedthrough. Typical SAW devices exhibit RF feedthrough which results in severe distortions in the frequency response causing spurious signals to be induced in the output signals. The spurious signals occur as the result of capacitive and resistive coupling between the closely spaced interface circuits and the SAW device.

Typical solutions to this problem have been to separate the SAW device sufficiently from the external circuitry to reduce the capacitive coupling to a negligible levels. However, for surface mount applications, the overall package size must be minimized. Thus, the SAW device must be fabricated to be as small as possible and in situations in which multiple SAW transducers are used, they must be packaged in physically close proximity. In this situation, increased. Also, spurious electrical currents are induced in the substrate material to which the SAW devices are bonded.

Therefore, it would be highly desirable to produce a relatively small sized SAW package for surface mount applications which is low in insertion loss and direct RF feedthrough.

SUMMARY OF THE INVENTION

In accordance with the present invention, a novel surface acoustic wave device package is shown.

A surface acoustic wave (SAW) device package provides for reduced insertion loss and direct RF feedthrough of the SAW device. The SAW device includes a substrate with input and output pads disposed on the substrate. Ground planes are disposed to surround each of the input and output pads. A SAW device is included which has SAW inputs and SAW outputs. The SAW inputs are connected to the input pads and the SAW outputs are connected to the output pads. The SAW device is bonded to the substrate. A seal affixes a lid to the substrate.

DESCRIPTION OF THE PREFERRED EMBODIMENT

Figure 1:
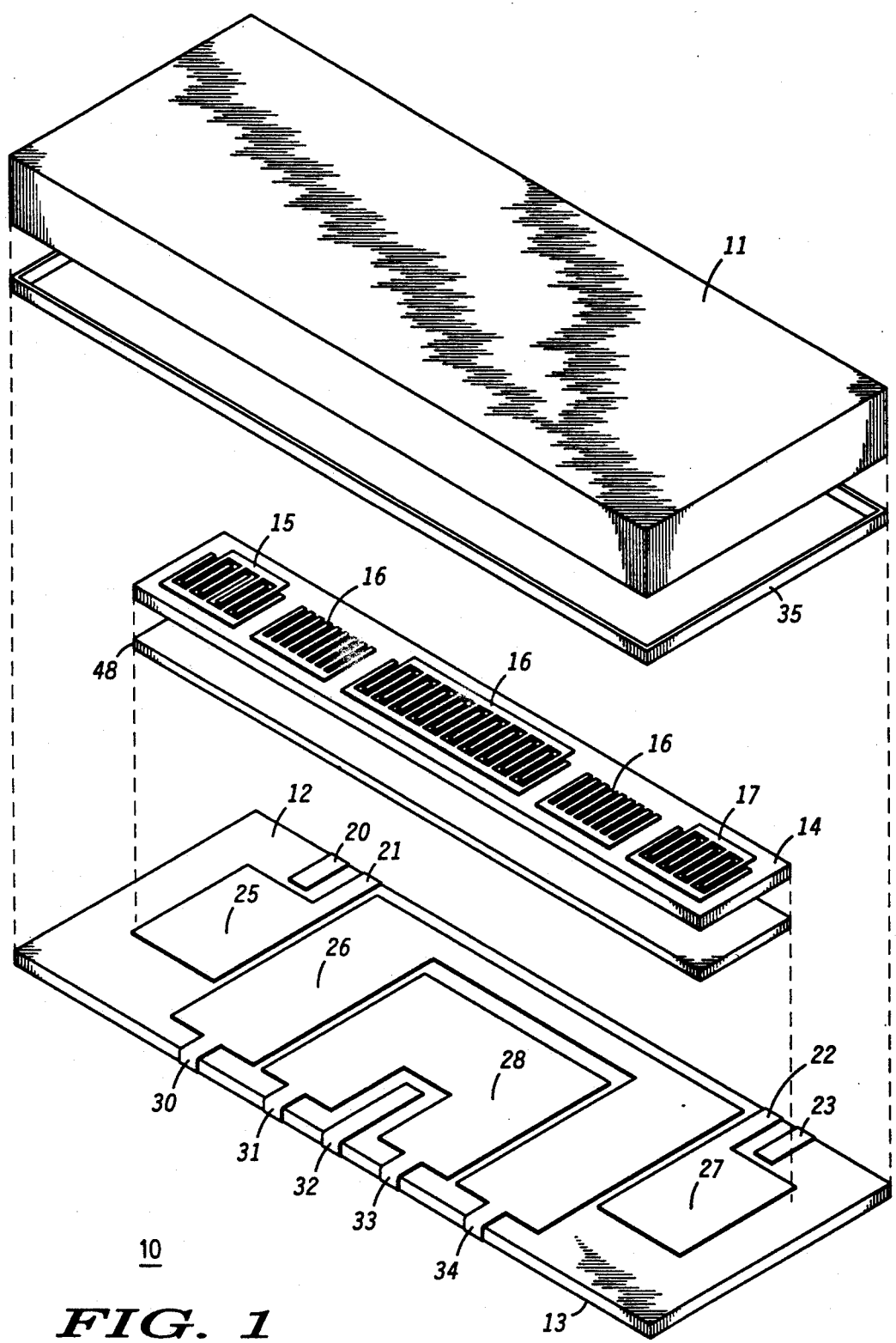
FIG. 1 is an assembly drawing of a surface acoustic (SAW) device packaging assembly in accordance with the present invention.

FIG. 1 is an assembly diagram of a SAW packaging device 10 in accordance with the principles of operation of the present invention. The package substrate 12 includes an alumina substrate having a bottom surface 13. Other ceramics may be used for this package substrate such as aluminium nitride, quartz or glass. Output pad 20 is disposed upon substrate 12. Similarly ground plane 25 is disposed in proximity to and substantially surrounds output pad 20 on substrate 12. Ground plane 25 includes output connection pad 21. Similarly, output pad 23 is disposed upon substrate 12. Ground plane 27 is disposed in proximity to and substantially surrounds output pad 23 and ground plane 27 includes output pad 22.

Figure 2:
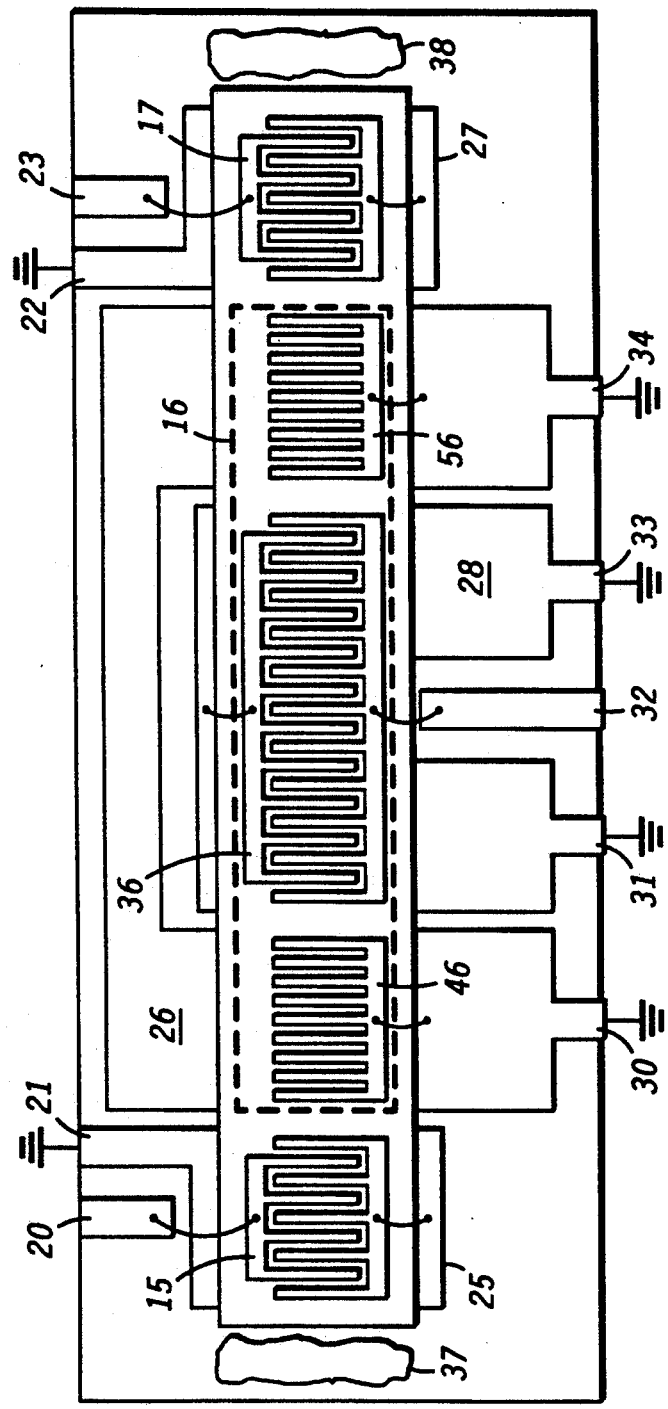
FIG. 2 is a schematic of the SAW device and electrical input/output connections in accordance with the present invention.

Input pad 32 is disposed on substrate 12 and is wrapped around the edge of substrate 12 to the bottom surface 13. This provides for the maximum distance between the input pad 32 which is located on bottom surface 13 of substrate 12 and the output pads 20 and 23 which are located on the top surface of substrate 12. The location of input pad 32 and output pads 20 and 23 could be switched to the opposite surfaces of substrate 12. That is, the input may be on the top surface and the outputs may be on the bottom surface 13. This arrangement helps minimize the insertion loss of the SAW device due to parasitic resistance and capacitance. Ground pads 30, 31, 33, and 34 are also similarly wrapped around the top surface of substrate 12 to the bottom surface 13 for electrical connection to external circuitry. Ground pads 30 and 34 are external circuit connections for ground plane 26. As shown in FIG. 2, dummy electrodes are connected to ground plane 26 to reduce parasitic capacitance and resistance. Similarly, ground pads 31 and 33 are the connections for ground plane 28 which surrounds input pad 32. A surface acoustic wave device is disposed over ground plane 28 and connected to the ground plane 28 as will be shown infra.

Shown above substrate 12 is the surface acoustic wave (SAW) crystal (substrate) 14 disposed on substrate 14 are three SAW devices 15, 16, and 17.

Substrate 14 is affixed to substrate 12 via a thermoplastic adhesive 48, so that SAW 15 overlays ground plane 25; SAW 16 overlays ground planes 26 and 28; and, SAW 17 overlays ground ground plane 27. Lid 11 is brought down to contact substrate 12 and is hermetically sealed with a low-temperature glass seal 35.

RF feedthrough causes insertion loss for SAW devices. One source of RF feedthrough is the flow of spurious electrical currents in the substrate of the SAW device. These currents flow because the residual metal resistance causes electrical connections to float slightly above true ground potential. In order to reduce RF feedthrough and insertion loss, the package substrate is constructed of a ceramic such as alumina. Further, each of the SAW devices is disposed over a metallized region of the substrate, such as 25, 26, 28, and 27. Further, the input 32 and the outputs 20 and 23 are in proximity to ground planes 28, 25, and 27 respectively, which are independently isolated to avoid any excessive parasitic capacitance which also leads to insertion loss. In addition, the input lead 32 is maximally distanced from the output leads 20 and 23 by having the input lead 32 wrapped around to the bottom side 13 of substrate 12. This configuration avoids capacitive or inductive coupling between the input and outputs.

Referring to FIG. 2, a schematic diagram of the SAW devices and their interconnections is shown. SAW 16 includes active SAW device including electrodes 36.

Further, SAW device 16 includes dummy electrodes 46 and 56 which are electrically grounded via pads 30 and 34 respectively. Dummy electrodes 46 and 56 are wire bonded to the underlying metallized region 26 which includes pads 30 and 34. SAW device comprising interdigitated electrodes 36 is wire bond connected to pad 32 which is connected to the input from the external circuitry. The metallized region 28 underlying the SAW device comprising electrodes 36 is connected to region 28 via a wire bond. This metallized region is also connected to an external electrical ground via pads 31 and 33 which surround and shield the input 32 from parasitic capacitance and resistance. The input applied via pad 32 to SAW 16 is transmitted in both directions through electrodes 36 and through dummy electrodes 46 in one direction and through electrodes 36 and through dummy electrodes 56 in the opposite direction.

SAW 15 receives the input via electrodes 46. SAW 15 is wire bonded to output pad 20 which transmits the filtered output. Metallized region 25 underlies SAW 15 and is connected to one of the electrode pairs of SAW 15. Connection pad 21 of metallized region 25 is connected to ground via external circuitry and it is proximity to and substantially surrounds pad 20 which provides the output signal. Pad 21 electrically shields output 20. Acoustic absorber material 37 prevents surface acoustic waves transmitted from SAW 15 from being reflected back into SAW 15.

Similarly, SAW 17 receives the surface acoustic waves transmitted via electrodes 56. SAW 17 is wire bonded to pad 23 which provides another output signal of the composite SAW device. Metallized region 27 underlies SAW 17 and is wire bonded to SAW 17. Pad 22 of metallized region 27 is connected to ground of the external circuitry (not shown). Ground pad 22 substantially surrounds and electrically shields output 23 providing for lower insertion loss. Acoustic absorber material 38 prevents reflection of surface acoustic waves transmitted from SAW 17 back into SAW 17.

A one input and two output SAW device is shown in FIG. 2. One of the SAW devices 15 or 17 may be eliminated and the device resulting may a one input one output SAW device which would operate at approximately one-half the efficiency of the device shown. The use of underlying metallized regions and input and output pads in proximity to grounded shielding outputs applies to any SAW configuration.

Figure 3:
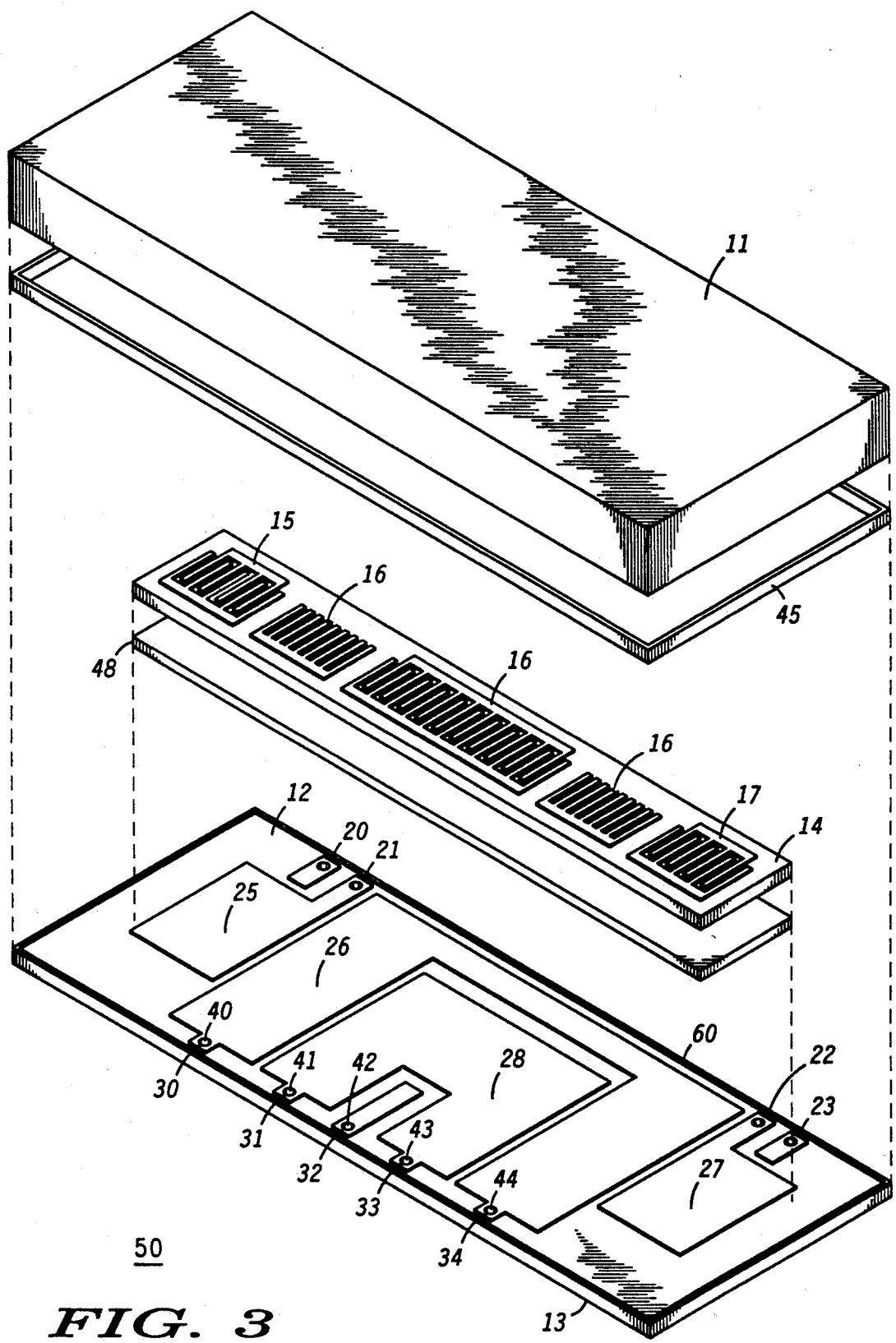
FIG. 3 is an alternate embodiment of a SAW device packaging arrangement in accordance with the present invention.

FIG. 3 depicts an assembly 50 of a SAW device package. SAW device package 50 is the same as described above for SAW device package 10 in FIG. 1. However, instead of connection pads 30 through 34 which wrap around substrate 12 to the bottom surface 13 as shown in FIG. 1, FIG. 3 depicts connection pads 30 through 34 of FIG. 1 which are passed through corresponding holes 40 through 44 in the substrate 12 to the bottom surface 13 of substrate 12 for electrical connection to external circuitry. This alternate embodiment of the present invention is useful when lid 11 is to be sealed to substrate 12 via a hermetic solder-type seal using a solder ring 45 which can be attached to the lid 11 and a seal ring 60. Seal ring 60 is a material (which can be soldered to) and is bonded to substrate 12. Solder seal 45 would typically short out electrodes 40 through 44, if they were wrapped around the surface of substrate 12 to the bottom surface 13. In this way, pads 30 through 34 are fed through the holes 40-44 respectively in substrate 12 to the bottom surface 13 for electrical connection. The solder seal 45 of lid 11 to substrate 12 may then take place without any danger of short circuiting the connection pads 40 through 44. This configuration provides for the advantage of not shorting out those pad connections which are wrapped around the substrate when solder sealing of lid 11 and substrate 12 is employed.

Figure 4:
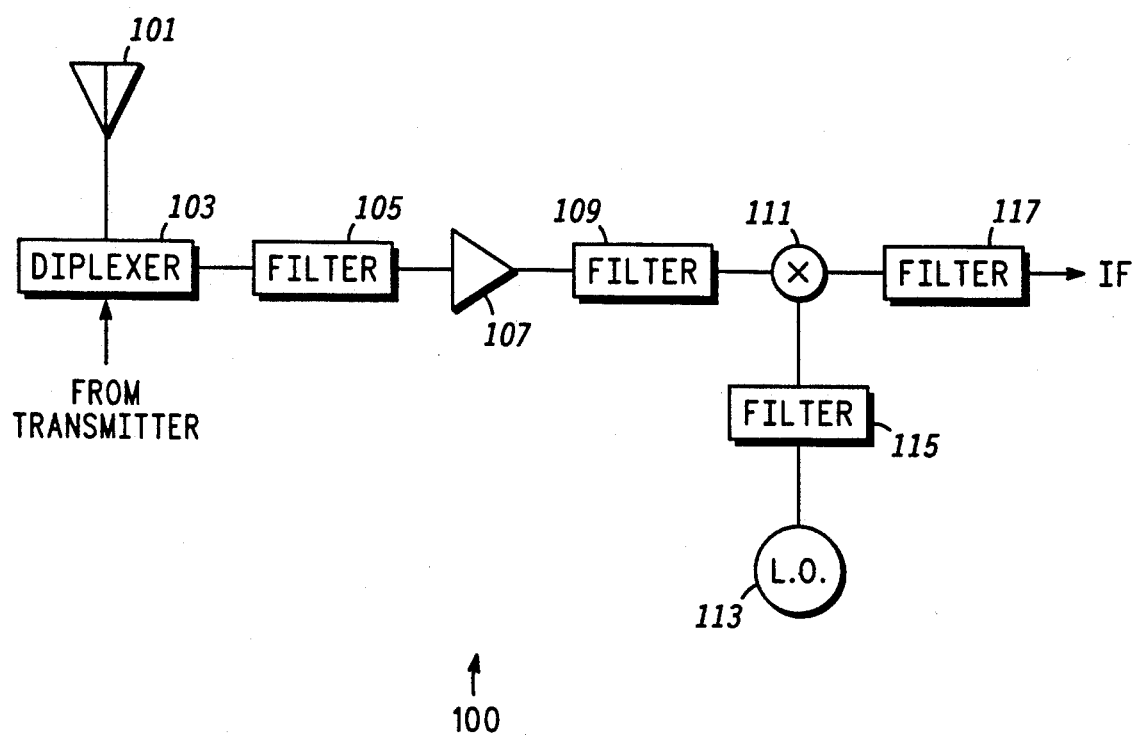
FIG. 4 is a block diagram of a radio receiver including surface acoustic wave filters in accordance with the present invention.

FIG. 4 depicts a radio receiver utilizing a number of surface acoustic wave (SAW) filters packaged in accordance with the present invention. Radio receiver 100 includes antenna 101 which is used to receive and transmit signals. Diplexer 103 is connected to antenna 101 and to the transmitter portion (not shown). Diplexer 103 transmits received signals to filter 105. Filter 105 may be a SAW filter according to the present invention. Filter 105 is connected to amplifier 107. The output of amplifier 107 is transmitted to SAW filter 109. Filter 109 transmits its output to mixer 111 where the output is combined with a signal from local oscillator 113 via SAW filter 115. The output of mixer 111 is then filtered by SAW 117 to provide the IF output.

The present invention provides for surface mounting applications of surface acoustic wave (SAW) filters which provide a relatively low insertion loss and RF feedthrough due to the use of underlying ground planes and due to maximum separation of input and output leads. Parasitic resistance and capacitance are minimized thereby producing a low insertion loss surface mountable SAW device.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A surface acoustic wave (SAW) device package for reducing insertion loss and direct RF feedthrough of a SAW device, the SAW device package comprising:
   substrate means including at least first and second surfaces;
   input means for connection to external circuitry, said input means disposed on said substrate means;
   output means for connection to external circuitry, said output means disposed on said substrate;
   shield means for preventing electrical coupling to said input means and said output means, said shield means disposed on said substrate means;
   SAW means including:
      SAW input means connected to said input means for transmitting an input signal to said SAW device;
      SAW output means connected to said output means for transmitting at least one output signal from said SAW device; and
      a SAW substrate, said SAW device disposed on said SAW substrate and positioned substantially over said shield means to inhibit parasitic electrical connection to said SAW device;
   said SAW device package further comprising bonding means disposed on said shield means and said substrate means, said bonding means for bonding said SAW substrate to said substrate means;
   lid means for physically covering said SAW means, said lid means positioned over said SAW means and in contact with said substrate means;
   means for sealing said lid means to said substrate means;
   said shield means including:

input shield means corresponding to said input means and substantially surrounding said input means; and output shield means corresponding to said output means and surrounding said output means on at least two sides;

said output means and said corresponding output shield means disposed on said first surface of said substrate means for connection to external circuitry; and said input means and said corresponding input shield means disposed on said first surface of said substrate means and wrapped around said substrate means to said second surface for connection to external circuitry.

2. The SAW device package as claimed in claim 1, wherein said bonding means includes a thermoplastic adhesive.

3. The SAW device package as claimed in claim 1, wherein said sealing means includes a low-melting-temperature glass for hermetically sealing said lid means to said substrate means.

4. The SAW device package as claimed in claim 1, wherein said SAW means includes:

a plurality of SAW devices including a central SAW device and first and second end SAW devices, said central SAW device being positioned between said first and second end SAW devices;

said central SAW device for receiving said input signal via said input means and said SAW input means, said central SAW device connected to said SAW input means; and said first end SAW device located on one end of said central SAW device and said second end SAW device located on an opposite end of said central SAW device, said first and second end SAW devices acoustically coupled to said central SAW device for providing said output signal in response to said input signal, said first and second end SAW devices connected to said SAW output means.

5. The SAW device package as claimed in claim 4, wherein:

said shield means includes a central shield and first and second end shields;

said central shield connected to said central SAW device;

said first end shield connected to said first end SAW device; and said second end shield connected to said second end SAW device.

6. The SAW device package as claimed in claim 5, wherein said central shield, said first end shield and said second end shield are each separately connected to electrical ground.

7. The SAW device package as claimed in claim 6, wherein there are further included first and second dummy electrode means, said first dummy electrode means disposed on said SAW substrate between said central SAW device and said first end SAW device, said second dummy electrode means disposed on said SAW substrate between said central SAW device and said second end SAW device; and said first and second dummy electrode means being separately connected to electrical ground.

8. A surface acoustic wave (SAW) device package for reducing insertion loss and direct RF feedthrough of a SAW device, the SAW device package comprising:

substrate means including at least first and second surfaces;

input means for connection to external circuitry, said input means disposed on said substrate means;

output means for connection to external circuitry, said output means disposed on said substrate;

shield means for preventing electrical coupling to said input means and said output means, said shield means disposed on said substrate means;

SAW means including:

SAW input means connected to said input means for transmitting an input signal to said SAW device;

SAW output means connected to said output means for transmitting at least one output signal from said SAW device;

a SAW crystal substrate; and said SAW device disposed on said SAW crystal substrate and positioned substantially over said shield means to inhibit parasitic electrical connection to said SAW device;

said SAW device package further comprising bonding means disposed on said shield means and said substrate means, said bonding means for bonding said SAW crystal substrate to said substrate means;

lid means for physically covering said SAW means, said lid means positioned over said SAW means and in contact with said substrate means;

said substrate means including holes through said substrate means from said first to said second surface, said holes for transmitting electrical connection from said input means or from said output means, and from said shield means, on said first surface to said second surface for electrical connection to external circuitry; and means for sealing said lid means to said substrate means.

9. The SAW device package as claimed in claim 8, wherein said bonding means includes a thermoplastic adhesive.

10. The SAW device package as claimed in claim 8, wherein said sealing means includes a solder seal for hermetically sealing said lid means to said substrate means.

11. The SAW device package as claimed in claim 8, wherein said SAW means includes:

a plurality of SAW device including a central SAW device and first and second end SAW devices, said central SAW device positioned between said first and second end SAW devices;

said central SAW device for receiving said input signal via said input means and said SAW input means, said central SAW device connected to said SAW input means; and said first end SAW device located on one end of said central SAW device and said second end SAW device located on an opposite end of said central SAW device, said first and said second end SAW devices acoustically coupled to said central SAW device for providing said at least one output signal in response to said input signal, said first and said second end SAW devices connected to said output means.

12. The SAW device package as claimed in claim 11, wherein:

said shield means includes a central shield and first and second end shields;

said central shield connected to said central SAW device;

said first end shield connected to said first end SAW device; and said second end shield connected to said second end SAW device.

13. The SAW device package as claimed in claim 12, wherein said central shield, said first end shield and said second end shield are each separately connected to electrical ground.

14. The SAW device package as claimed in claim 13, wherein there are further included:

first and second dummy electrode means, said first dummy electrode means disposed on said SAW crystal substrate between said central SAW device and said first end SAW device, said second dummy electrode means disposed on said SAW crystal substrate between said central SAW device and said second end SAW device; and said first and second dummy electrode means being separately connected to electrical ground.

15. A surface acoustic wave (SAW) device package for reducing insertion loss and direct RF feedthrough of a SAW device, the SAW device package comprising:

substrate means including at least first and second surfaces;

input means for connection to external circuitry, said input means disposed on said substrate means;

output means for connection to external circuitry, said output means disposed on said substrate;

shield means for preventing electrical coupling to said input means and said output means, said shield means disposed on said substrate means;

SAW means including:

SAW input means connected to said input means for transmitting an input signal to said SAW device;

SAW output means connected to said output means for transmitting at least one output signal from said SAW device; and a SAW substrate, said SAW device disposed on said SAW substrate and positioned substantially over said shield means to inhibit parasitic electrical connection to said SAW device;

said SAW device package further comprising bonding means disposed on said shield means and said substrate means, said bonding means for bonding said SAW substrate to said substrate means;

lid means for physically covering said SAW means, said lid means positioned over said SAW means and in contact with said substrate means;

means for sealing said lid means to said substrate means;

said shield means including input shield means corresponding to said input means and surrounding said input means on at least two sides;

said shield means including output shield means corresponding to said output means and substantially surrounding said output means;

said input means and said corresponding input shield means disposed on said first surface of said substrate means for electrical connection to external circuitry; and said output means and said corresponding output shield means disposed on said first surface of said substrate means and are wrapped around said substrate means to said second surface of substrate means for electrical connection to external circuitry.

16. A method for packaging a SAW device, the method comprising the steps of:

providing a ceramic substrate having a top and a bottom surface;

disposing an input pad on the top surface of the ceramic substrate and wrapping the input pad around to the bottom surface of the ceramic substrate;

disposing output pads on the top surface of the ceramic substrate;

disposing a plurality of ground planes on the top surface of the ceramic substrate, each of the plurality of ground planes substantially surrounding a corresponding input pad or surrounding a corresponding output pad on at least two sides;

providing a SAW crystal substrate including at least one SAW device;

bonding the SAW crystal substrate to the ceramic substrate so that the at least one SAW device is substantially over a first ground plane of the plurality of ground planes;

connecting the at least one SAW device to the first ground plane;

connecting the at least one SAW device to the input and output pads;

providing a lid; and hermetically sealing the lid to the ceramic substrate.

17. In a radio, at least one surface acoustic wave (SAW) device package for reducing insertion loss and direct RF feedthrough of a SAW device, the SAW device package comprising:

substrate means including at least first and second surfaces;

input means for connection to external circuitry, said input means disposed on said substrate means;

output means for connection to external circuitry, said output means disposed on said substrate;

shield means for preventing electrical coupling to said input means and said output means, said shield means disposed on said substrate and substantially surrounding said input means and surrounding said output means on at least two sides, said shield means including input shield means corresponding to said input means and substantially surrounding said input means, said input means and said corresponding input shield means disposed on said first surface of said substrate means and wrapped around said substrate means to said second surface for connection to external circuitry;

SAW means including:

SAW input means connected to said input means for transmitting an input signal to said SAW device;

SAW output means connected to said output means for transmitting at least one output signal from said SAW device; and a SAW substrate, said SAW device disposed on said SAW substrate and positioned substantially over said shield means to inhibit parasitic electrical connection to said SAW device;

bonding means disposed on said shield means and said substrate means, said bonding means for bonding said SAW substrate to said substrate means;

said SAW device package further comprising lid means for physically covering said SAW means, said lid means positioned over said SAW means and in contact with said substrate means; and means for sealing said lid means to said substrate means.

18. In a radio, at least one surface acoustic wave (SAW) device package for reducing insertion loss and direct RF feedthrough of a SAW device, the SAW device package comprising;
- substrate means including at least first and second surface;
- input means for connection to external circuitry, said input means disposed on said substrate means;
- output means for connection to external circuitry, said output means disposed on said substrate;
- shield means for preventing electrical coupling to said input means and said output means, said shield means disposed on said substrate means and substantially surrounding said input means and surrounding said output means on at least two sides;
- SAW means including;
  - SAW input means connected to said input means for transmitting an input signal to said SAW device; and
  - SAW output means connected to said output means for transmitting at least one output signal from said SAW means; and
  - a SAW substrate, said SAW device disposed on said SAW substrate and positioned substantially over said shield means to inhibit parasitic electrical connection to said SAW device;
- said SAW device package further comprising lid means for physically covering said SAW means, said lid means positioned over said SAW mans and in contact with said substrate means;
- bonding means disposed on said shield means and said substrate means, said bonding means for bonding said SAW substrate to said substrate means;
- said substrate means including holes through said substrate means from said first to said second surface, said holes for transmitting electrical connection from said input means or alternatively from said output means, and from said shield means, on said first surface to said second surface for electrical connection to external circuitry; and
- means for sealing said lid means to said substrate means.

* * * * *